United States Patent
Tanaka et al.

(10) Patent No.: US 10,181,508 B2
(45) Date of Patent: Jan. 15, 2019

(54) SEMICONDUCTOR DEVICE AND MANUFACTURING METHOD THEREOF

(71) Applicant: FUJI ELECTRIC CO., LTD., Kanagawa (JP)

(72) Inventors: Hiroyuki Tanaka, Matsumoto (JP); Kota Ohi, Matsumoto (JP); Yuichi Onozawa, Matsumoto (JP); Yoshihiro Ikura, Matsumoto (JP); Kazutoshi Sugimura, Okaya (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/445,991

(22) Filed: Mar. 1, 2017

(65) Prior Publication Data

US 2017/0271440 A1    Sep. 21, 2017

(30) Foreign Application Priority Data

Mar. 16, 2016    (JP) .................................. 2016-053015

(51) Int. Cl.
*H01L 29/06*        (2006.01)
*H01L 21/288*       (2006.01)
(Continued)

(52) U.S. Cl.
CPC ........ *H01L 29/0619* (2013.01); *H01L 21/288* (2013.01); *H01L 23/535* (2013.01); *H01L 23/58* (2013.01); *H01L 29/0692* (2013.01); *H01L 29/0696* (2013.01); *H01L 29/401* (2013.01); *H01L 29/402* (2013.01); *H01L 29/0615* (2013.01); *H01L 29/0878* (2013.01); *H01L 29/41708* (2013.01); *H01L 29/41725* (2013.01); *H01L 29/45* (2013.01); *H01L 29/7393* (2013.01);
(Continued)

(58) Field of Classification Search
CPC . H01L 29/0619; H01L 29/402; H01L 21/288; H01L 23/535
See application file for complete search history.

(56) References Cited

U.S. PATENT DOCUMENTS

2007/0210350 A1\* 9/2007 Omura ................ H01L 23/4824
                                                             257/287
2009/0152667 A1\* 6/2009 Rieger ................ H01L 29/0623
                                                             257/488
(Continued)

FOREIGN PATENT DOCUMENTS

JP            2014-175640 A        9/2014

*Primary Examiner* — Marc Armand
*Assistant Examiner* — Sarah Salerno

(57) ABSTRACT

Provided is a guard ring section to which a fine processing is easily applied. Provided is a semiconductor device comprising: a semiconductor substrate; an active region formed in the semiconductor substrate; and a guard ring section formed more outside than the active region in the semiconductor substrate, wherein the guard ring section includes: a guard ring formed in a circular pattern on an upper surface of the semiconductor substrate; an interlayer insulating film formed above the guard ring; a field plate formed in a circular pattern along the guard ring and above the interlayer insulating film; and a tungsten plug formed in a circular pattern along the guard ring and penetrating the interlayer insulating film to connect the guard ring and the field plate.

10 Claims, 11 Drawing Sheets

(51) Int. Cl.
*H01L 23/535* (2006.01)
*H01L 29/40* (2006.01)
*H01L 23/58* (2006.01)
H01L 29/417 (2006.01)
H01L 29/45 (2006.01)
H01L 29/739 (2006.01)
H01L 29/78 (2006.01)
H01L 29/08 (2006.01)

(52) U.S. Cl.
CPC ....... *H01L 29/7811* (2013.01); *H01L 29/7813* (2013.01); *H01L 2224/05* (2013.01); *H01L 2224/4847* (2013.01); *H01L 2224/48463* (2013.01)

(56) References Cited

U.S. PATENT DOCUMENTS

| | | |
|---|---|---|
| 2010/0025820 A1 | 2/2010 | Suekawa |
| 2010/0289110 A1 | 11/2010 | Tarui et al. |
| 2012/0068310 A1 | 3/2012 | Uemura |
| 2014/0374791 A1* | 12/2014 | Matsudai .............. H01L 29/404 257/139 |
| 2015/0364541 A1* | 12/2015 | Senoo .................... H01L 29/404 257/490 |
| 2017/0256503 A1* | 9/2017 | Fujii .................... H01L 21/761 |

* cited by examiner

SEMICONDUCTOR DEVICE AND MANUFACTURING METHOD THEREOF

The contents of the following Japanese patent application are incorporated herein by reference:
NO. 2016-053015 filed in JP on Mar. 16, 2016.

BACKGROUND

1. Technical Field

The present invention relates to a semiconductor device and a manufacturing method thereof.

2. Related Art

Conventionally, the device has been known in which a guard ring structure is provided at an outer periphery of semiconductor elements (For example, refer to Patent Document 1). This improves a breakdown voltage during turn off.
Patent Document 1: Japanese Patent Application Publication No. 2010-267655

Provided is a guard ring structure to which a fine processing is easily applied.

SUMMARY

In a first aspect of the present invention, provided is a semiconductor device. The semiconductor device may comprise a semiconductor substrate. The semiconductor device may comprise an active region formed in the semiconductor substrate. The semiconductor device may comprise a guard ring section formed more outside than the active region in the semiconductor substrate. The guard ring section may include a guard ring formed on an upper surface of the semiconductor substrate. The guard ring may be formed in a circular pattern. The guard ring section may include an interlayer insulating film formed above the guard ring. The guard ring section may include a field plate formed above the interlayer insulating film. The field plate may be formed in a circular pattern along the guard ring. The guard ring section may include a tungsten plug penetrating the interlayer insulating film to connect the guard ring and the field plate. The tungsten plug may be formed in a circular pattern along the guard ring.

The field plate may be formed of tungsten. A plurality of the circular tungsten plugs may be formed between the guard ring and the field plate which correspond to each other. The guard ring section may include a connection plug connecting two adjacent tungsten plugs. A distance between two adjacent tungsten plugs in the plurality of circular tungsten plugs may be larger than a width of one tungsten plug.

The semiconductor device may comprise an element electrode provided above the active region. The element electrode may be formed of aluminum-containing material. The semiconductor device may comprise a plating layer formed on the element electrode. The semiconductor device may comprise a protection film formed on a plating layer. The protection film may expose some regions of the plating layer.

The semiconductor device may comprise a semiconductor element section formed in the active region. The semiconductor device may comprise a hole diverting plug provided between the semiconductor element section and the guard ring section to penetrate the interlayer insulating film. The hole diverting plug may be formed of tungsten.

The semiconductor device may comprise an element electrode provided above the active region. The field plate may be formed of the same material as that of the element electrode.

In a second aspect of the present invention, provided is a manufacturing method of a semiconductor device. A manufacturing method may comprise a guard ring forming step of forming a guard ring in a circular pattern on an upper surface of a semiconductor substrate. The manufacturing method may comprise an insulating film forming step of forming an interlayer insulating film above the guard ring. The manufacturing method may comprise a step of forming a tungsten plug provided in a circular pattern along the guard ring to penetrate the interlayer insulating film. The manufacturing method may comprise a field plate forming step of forming a field plate in a circular pattern provided along the guard ring and above the interlayer insulating film to connect to the tungsten plug.

The manufacturing method may comprise an element electrode forming step of forming an element electrode in an active region surrounded by the guard ring on the upper surface of the semiconductor substrate. The element electrode may be formed of aluminum-containing material. The manufacturing method may comprise a plating step of forming a plating layer on the element electrode after the element electrode forming step and the field plate forming step by plating the upper surface side of the semiconductor substrate. The manufacturing method may comprise a protection film forming step of forming a protection film at the upper surface side of the semiconductor substrate.

The summary clause does not necessarily describe all necessary features of the embodiments of the present invention. The present invention may also be a sub-combination of the features described above.

DESCRIPTION OF THE EMBODIMENT

Hereinafter, the present invention will be described by way of the embodiments of the invention. However, the embodiments described below are not to limit the scope of the claimed invention. Also, all of the combinations of the characteristics described in the embodiments are not necessarily required for means for solving the problem of the invention.

Figure 1:
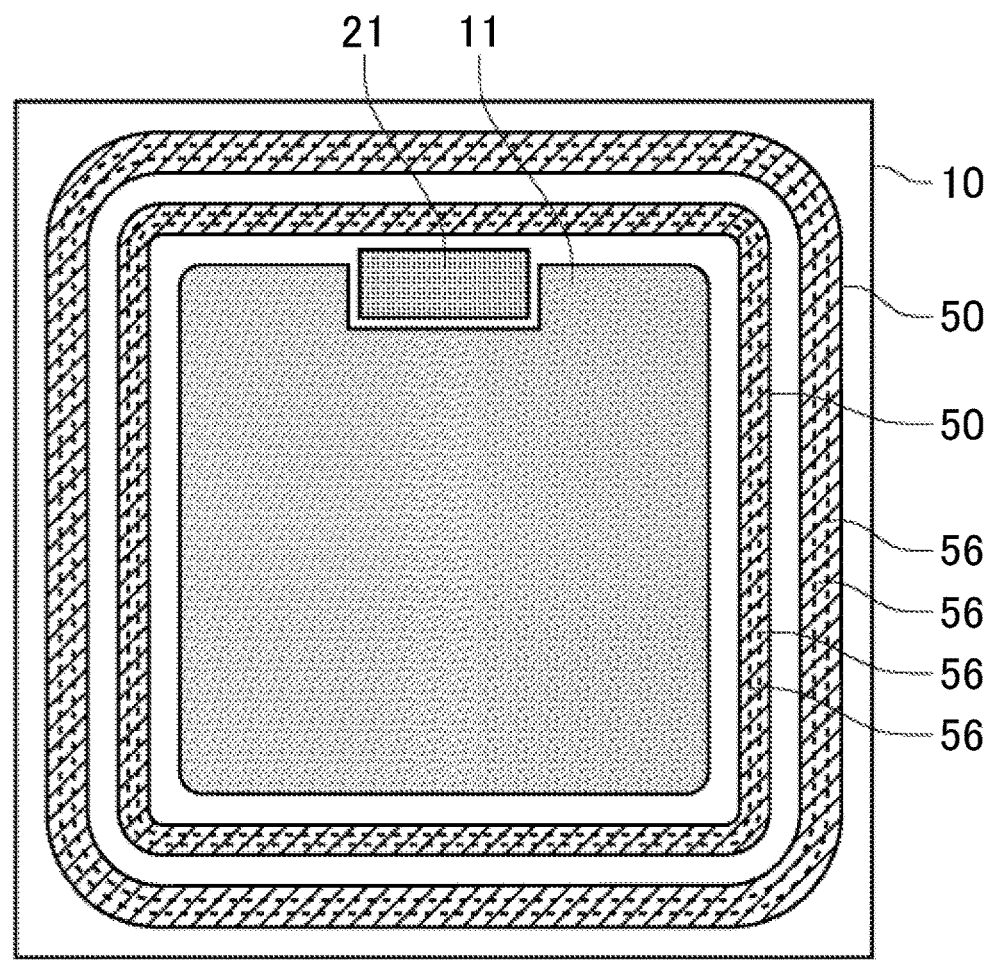
FIG. 1 is a plan view schematically illustrating a semiconductor device 100 according to one embodiment of the present invention.

FIG. 1 is a plan view schematically illustrating a semiconductor device 100 according to one embodiment of the present invention. The semiconductor device 100 comprises a semiconductor substrate 10 formed of, for example, silicon or a compound semiconductor. The semiconductor substrate 10 is provided with an active region 11, a pad 21 and one or more guard ring sections 50.

The active region 11 includes semiconductor elements formed therein such as an IGBT (Insulated Gate Bipolar Transistor), a power MOSFET, a free wheel diode. The pad 21 is formed within the active region 11 or in a region adjacent to the active region 11. For example, the pad 21 is electrically connected to a gate electrode of the semiconductor elements formed in the active region 11.

One or more guard ring sections 50 are formed on an upper surface of the semiconductor substrate 10 and more outside than the active region 11. In the present example, each guard ring section 50 is formed in a concentric manner to surround the active region 11.

At least one guard ring section 50 includes a tungsten plug 56 formed in a circular pattern along the guard ring section 50. In the present example, each guard ring section 50 is provided with two tungsten plugs 56.

Figure 2:
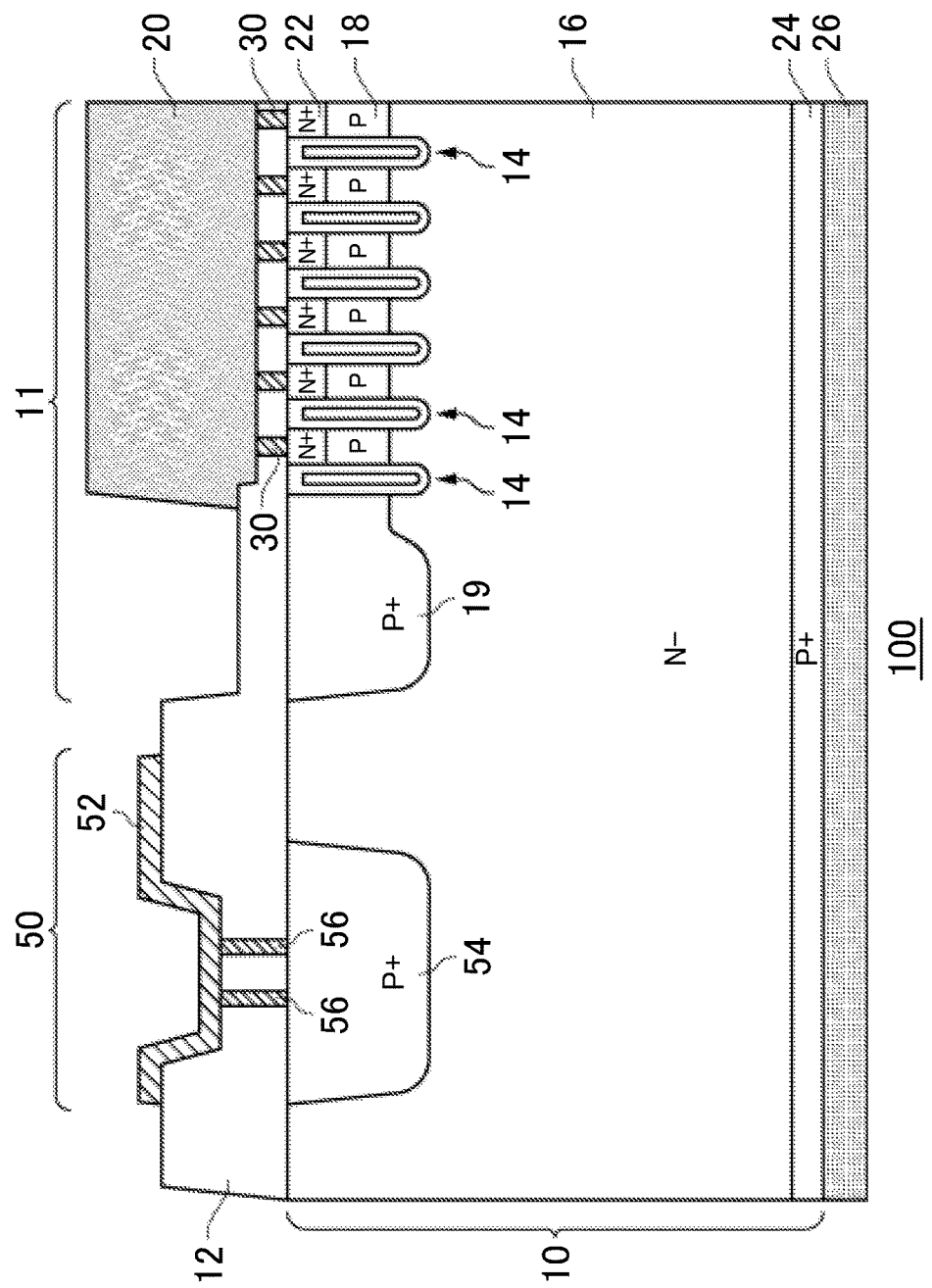
FIG. 2 is a diagram illustrating one example of a cross section of the semiconductor device 100.

FIG. 2 is a diagram illustrating one example of a cross section of the semiconductor device 100. FIG. 2 illustrates a partial cross sectional view of the border between the active region 11 and the guard ring section 50 and the vicinity thereof. Although one guard ring section 50 is illustrated in FIG. 2, the semiconductor device 100 may include a plurality of guard ring sections 50 formed in a concentric manner on the upper surface of the semiconductor substrate 10. The semiconductor device 100 in the present example includes an IGBT in the active region 11. The semiconductor substrate 10 includes a drift region 16 formed therein. The drift region 16 has a conductivity type of N− type. Note that a conductivity type of each layer or region may also be reversed.

A P+ type collector region 24 is formed under the drift region 16. A collector electrode 26 is formed under the collector region 24. In the active region 11, a P type base region 18 is formed on the drift region 16. The base region 18 may connect to a P+ type well region 19 formed in the active region 11 at the outer side thereof. An N+ type emitter region 22 is formed on the base region 18.

On the upper surface of the semiconductor substrate 10, an emitter region 22 and a plurality of gate structures 14 penetrating the base region 18 are formed. Each gate structure 14 includes a gate insulating film and a gate electrode in the trench penetrating the emitter region 22 and the base region 18. The gate insulating film is formed to cover an inner wall of the trench. The gate electrode is covered by the gate insulating film in the trench. The gate electrode is at least formed in the range opposite to the base region 18. If a given ON voltage is applied to the gate electrode, a channel is formed in the base region 18 opposite to the gate electrode.

The upper surface of the semiconductor substrate 10 is covered by an interlayer insulating film 12. In the active region 11, an emitter electrode 20, one example of an element electrode, is formed on the interlayer insulating film 12. The emitter electrode 20 is electrically connected to the emitter region 22 by a connection portion 30 provided to penetrate the interlayer insulating film 12.

The connection portion 30 may be a plug formed of tungsten. This can provide the connection portion 30 at a micropitch, thereby providing a fine semiconductor device 100.

The guard ring section 50 includes the guard ring 54, the interlayer insulating film 12, the field plate 52 and the tungsten plug 56. The guard ring 54 is a P+ type region formed in the semiconductor substrate 10 to contact the upper surface of the semiconductor substrate 10. The guard ring 54 is formed in a circular pattern to surround the active region 11 on the upper surface of the semiconductor substrate 10. Providing the guard ring 54 can extend a depletion layer generated at the upper surface side of the semiconductor substrate 10 during turn off to outside the active region 11. This can inhibit concentration of the electric field at the end of the active region 11, thereby improving the breakdown voltage.

In the guard ring section 50, the interlayer insulating film 12 is formed above the guard ring 54. The interlayer insulating film 12 is a field oxide film, for example. The field plate 52 is provided to be opposite to the guard ring 54 above the interlayer insulating film 12.

The field plate 52 is formed in a circular pattern along the guard ring 54. In a plane parallel to the upper surface of the semiconductor substrate 10, at least one of end sides of the field plate 52 is provided to protrude more than end sides of the guard ring 54. Applying voltage to the field plate 52 allows an expansion of the depletion layer generated at the upper surface side of the semiconductor substrate 10 to be controlled.

The tungsten plug 56 penetrates the interlayer insulating film 12 to electrically connect the field plate 52 and the guard ring 54. The tungsten plug 56 may be formed in the same step as the connection portion 30.

The tungsten plug 56 is formed in a circular pattern along the guard ring 54. Forming the tungsten plugs 56 serially in a circular pattern can enhance the reliability of an electrical connection between the guard ring 54 and the field plate 52, compared to providing the tungsten plugs 56 in a discrete manner. Also, a potential can be applied to the entire guard rings 54 evenly.

In the present example, for one pair of the field plate 52 and the guard ring 54, two or more tungsten plugs 56 are formed. Two or more tungsten plugs 56 are arranged in a concentric manner on the upper surface of the semiconductor substrate 10. Also, each tungsten plug 56 may be arranged along a rounded-corner rectangle having four arc-like corners and straight lines connecting the adjacent corners. Providing two or more tungsten plugs 56 can further enhance the reliability of the electrical connection between the field plate 52 and the guard ring 54. Also, a potential in the guard ring 54 can be distributed evenly.

Also, if the tungsten plugs 56 are formed by way of etchback, a tungsten plug 56 having a large diameter or width is also removed during etchback. As in the present example, providing a plurality of tungsten plugs 56 having a small diameter or width can increase a contact area between the field plate 52 and the guard ring 54, while easily forming the tungsten plugs 56.

The field plate 52 may be formed of tungsten. In this case, an outer surface of the field plate 52 is naturally oxidized to be $WO_3$. This can improve a corrosion resistance compared to those using aluminum and the like.

Note that the field plate 52 may be formed integrally with the tungsten plug 56. For example, after an opening for the plug is formed through the interlayer insulating film 12, a tungsten film is formed on the interlayer insulating film 12.

Then, depending on the shape of the field plate 52, the tungsten film is patterned, for example, by way of photolithography. This allows the tungsten plug 56 and the field plate 52 to be formed in the same step.

Also, preferably the field plate 52 is formed after the gate structure 14 and the like are formed in the active region 11 and the opening for the plug is provided through the interlayer insulating film 12. As a comparative example, if the field plate is formed of polysilicon, a polysilicon electrode of the gate structure 14 and the field plate may be formed in the same step to prevent increase in the number of steps. In this case, the interlayer insulating film and the opening for the plug are formed after the field plate is formed.

However, if the interlayer insulating film and the opening are formed after the field plate is formed, a difference in level of the field plate makes it difficult to perform a fine processing in the vicinity of the field plate. Therefore, an interval between the field plate and the active region must be larger to form the active region having a microstructure, thereby increasing the chip size.

On the other hand, forming the field plate 52 after the interlayer insulating film 12 and the opening are provided can form the field plate 52 in the vicinity of the active region 11. Therefore, the chip size can be reduced.

Preferably, the field plate 52, the tungsten plug 56 and the connection portion 30 are formed in the same step. This can shorten the manufacturing steps. However, the material of the field plate 52 is not limited to tungsten. The field plate 52 may be formed of the same material as that of the emitter electrode 20, or may be formed of other materials.

Figure 3:
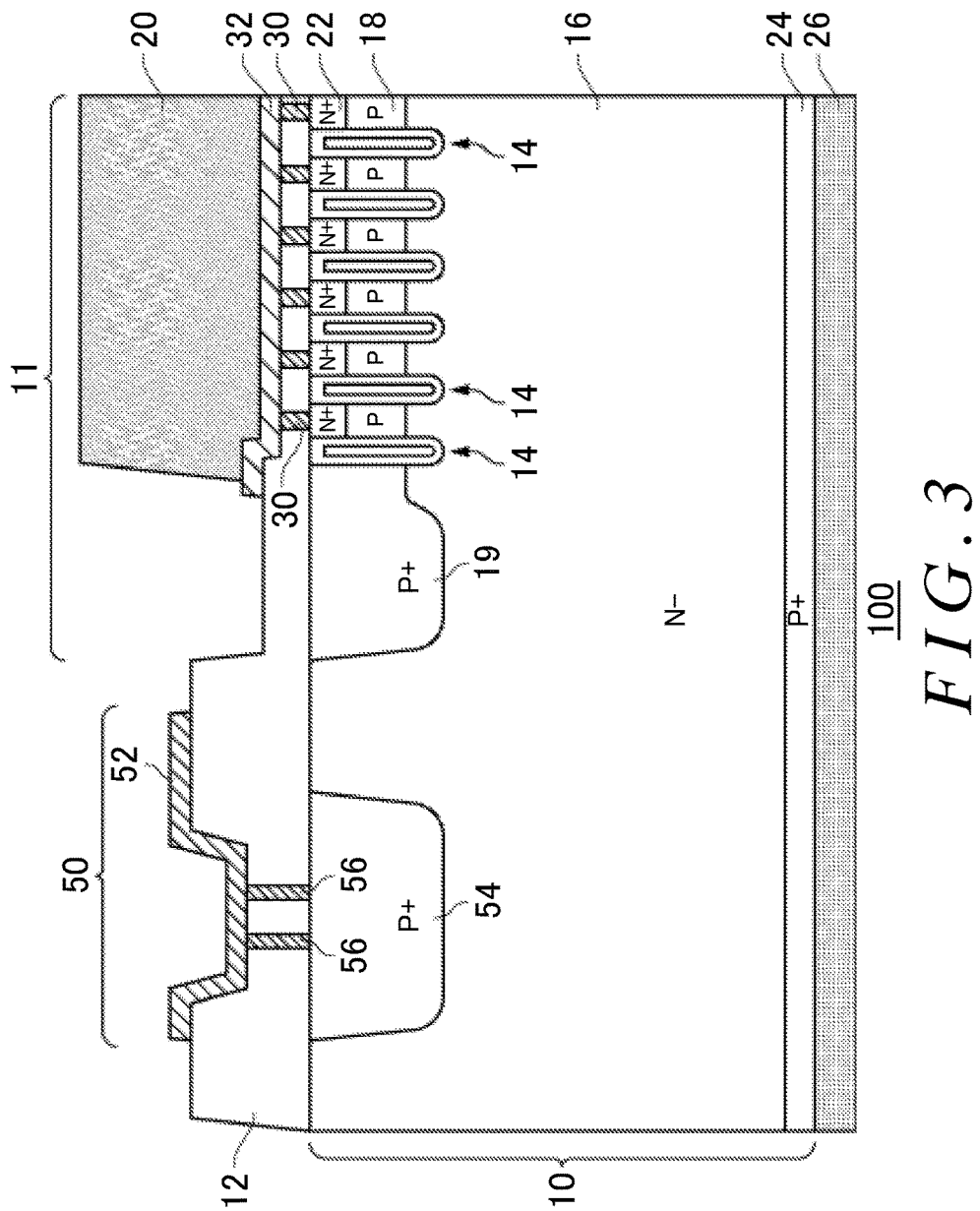
FIG. 3 is a cross sectional view illustrating another exemplary structure of the semiconductor device 100.

FIG. 3 is a cross sectional view illustrating another exemplary structure of the semiconductor device 100. The semiconductor device 100 of the present example further comprises a foundation electrode 32, in contrast to the semiconductor device 100 illustrated in FIG. 2. Other structures are the same as those of the semiconductor device 100 illustrated in FIG. 2. In present example, the foundation electrode 32, the field plate 52 and the connection portion 30 are formed of tungsten.

The foundation electrode 32 is provided between the emitter electrode 20 and the interlayer insulating film 12. Preferably, the foundation electrode 32 is formed in the same step as the field plate 52.

Figure 4:
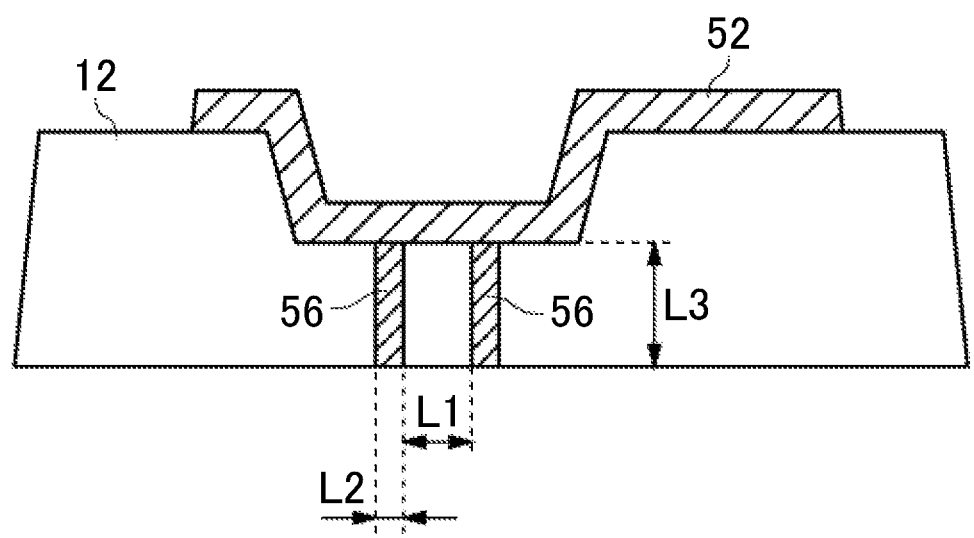
FIG. 4 is an enlarged cross sectional view of the tungsten plug 56 and the vicinity thereof.

FIG. 4 is an enlarged cross sectional view of the tungsten plug 56 and the vicinity thereof. A distance L1 between two adjacent tungsten plugs 56 may be larger than a width L2 of one tungsten plug 56. As one example, the width L2 of one tungsten plug 56 is 0.4 micrometers or more, and 0.6 micrometers or less. Also, the distance L1 of the tungsten plug 56 is 0.8 micrometers or more, and 1.2 micrometers or less.

If the distance L1 is larger than the width L2, the interlayer insulating film 12 sandwiched by the adjacent tungsten plugs 56 can have a stable shape, thereby inhibiting failure to form the tungsten plug 56. This stabilizes the contact resistance, thereby improving the long-term reliability of electrical characteristics such as an element breakdown voltage and a leakage current in an OFF state in which no current flows. Also, if the tungsten plugs 56 are formed to have a shape with a relatively large length in the longitudinal direction such as a striped or circular pattern, the deformation of the tungsten plug 56 can also be inhibited. A height L3 of the tungsten plug 56 may be almost the same as the width L2 or shorter than the width L2. Alternatively, the height L3 may be 70% or more of the width L2, and may be 80% or more. Therefore, a groove formed in the interlayer insulating film 12 can be filled up with tungsten without voids.

Figure 5:
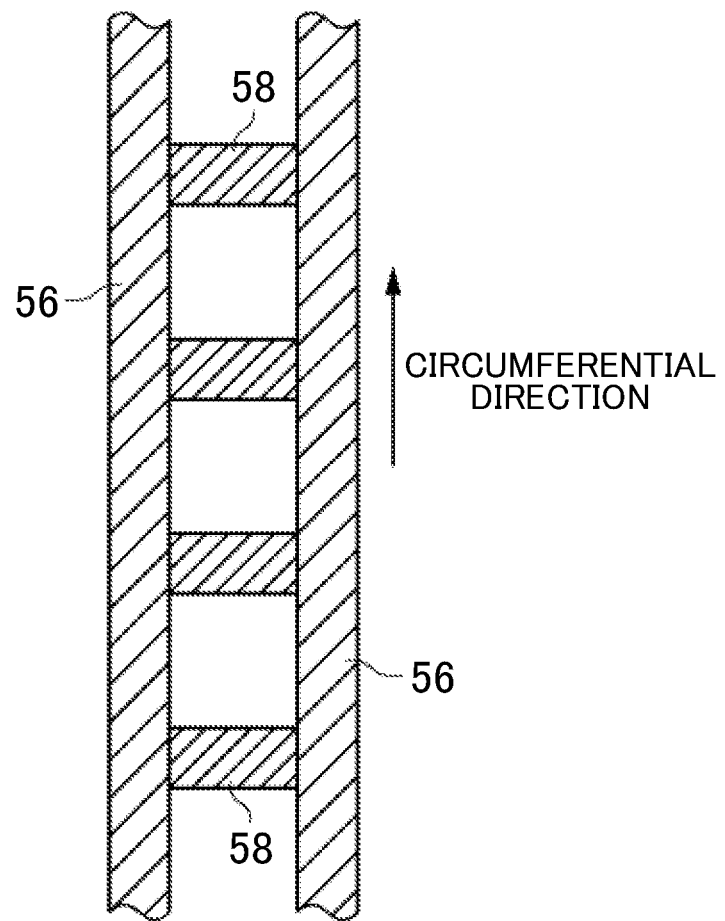
FIG. 5 is a diagram illustrating an exemplary shape of the tungsten plug 56 on the upper surface of the semiconductor substrate 10.

FIG. 5 is a diagram illustrating an exemplary shape of the tungsten plug 56 on the upper surface of the semiconductor substrate 10. The guard ring section 50 may further include a connection plug 58 to connect two adjacent tungsten plugs 56. The connection plug 58 is formed of conductive material. This allows a potential in two adjacent tungsten plugs 56 to be distributed evenly.

A plurality of connection plugs 58 may be provided in a discrete manner in a circumferential direction of the tungsten plugs 56 provided in a circular pattern. This allows a potential in the tungsten plugs 56 to be distributed evenly, even if the tungsten plugs 56 are disconnected in the circumferential direction, for example, due to variations in manufacturing.

The connection plug 58 may be formed to the same depth as that of the tungsten plug 56. The connection plug 58 may be formed of tungsten. The connection plug 58 may be formed in the same step as the tungsten plug 56.

Figure 6A:
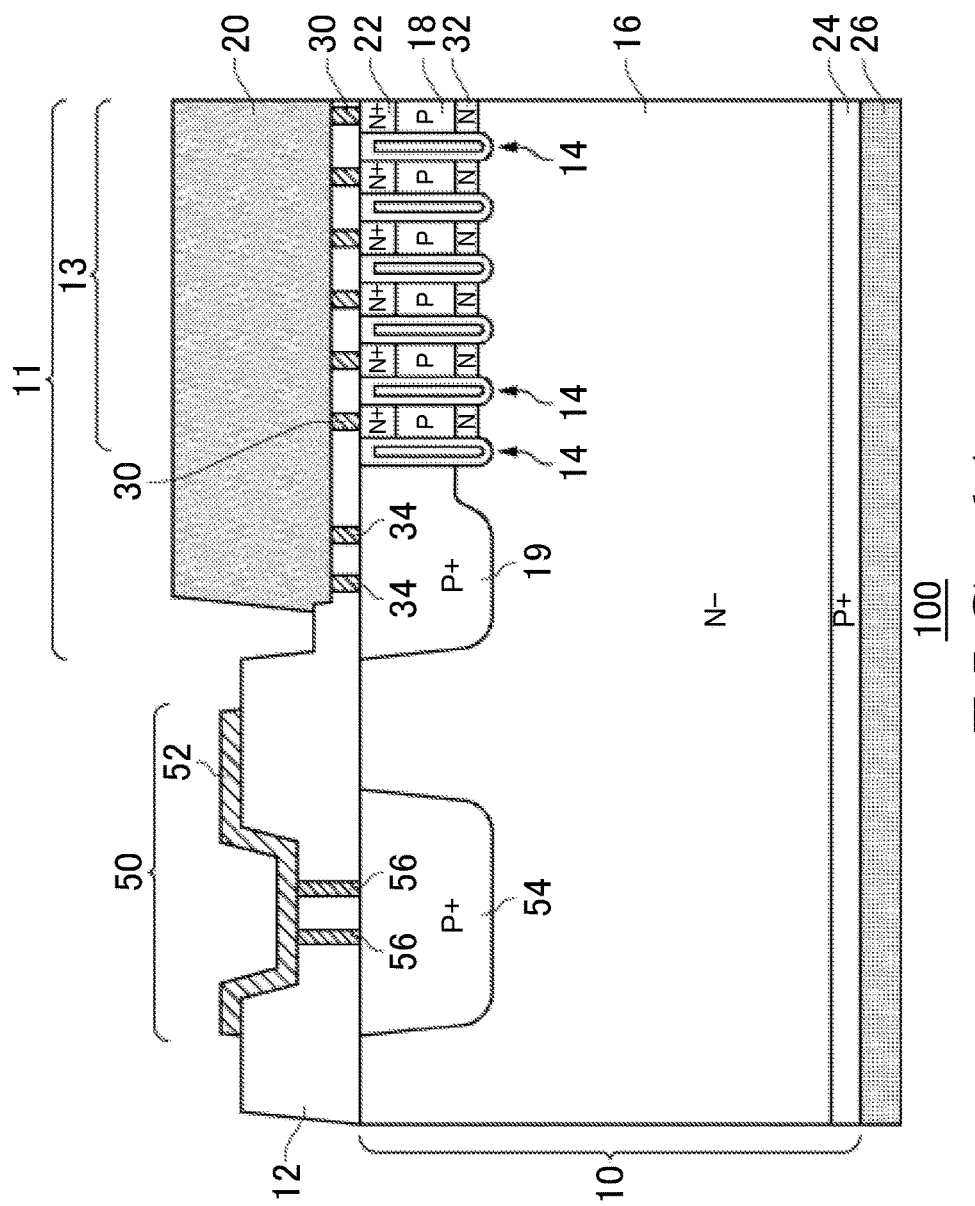
FIG. 6A is a diagram illustrating another exemplary cross section of the semiconductor device 100.

FIG. 6A is a diagram illustrating another exemplary cross section of the semiconductor device 100. The semiconductor device 100 of the present example further comprises one or more hole diverting plugs 34, in addition to the configuration of the semiconductor device 100 illustrated in FIG. 2.

The hole diverting plug 34 is formed of tungsten. The hole diverting plug 34 penetrates the interlayer insulating film 12 between the semiconductor element section 13 including, for example, the gate structure 14 and the emitter region 22 formed therein, and the guard ring section 50. The hole diverting plug 34 electrically connects the emitter electrode 20 and the well region 19.

Such a configuration allows holes between the semiconductor element section 13 and the guard ring section 50 to be efficiently diverted. This allows the semiconductor element section 13 to work faster. Also, as the hole diverting plug 34 is formed of tungsten, the hole diverting plug 34 can be easily formed even in the microstructure having a short distance between the semiconductor element section 13 and the guard ring section 50.

The hole diverting plugs 34 may be formed in a circular pattern to surround the semiconductor element section 13, or may be formed in a discrete manner around the semiconductor element section 13. Also, a plurality of hole diverting plugs 34 may be formed in a concentric manner to surround the semiconductor element section 13. Preferably, the hole diverting plug 34 is formed in the same step as the tungsten plug 56.

Figure 6B:
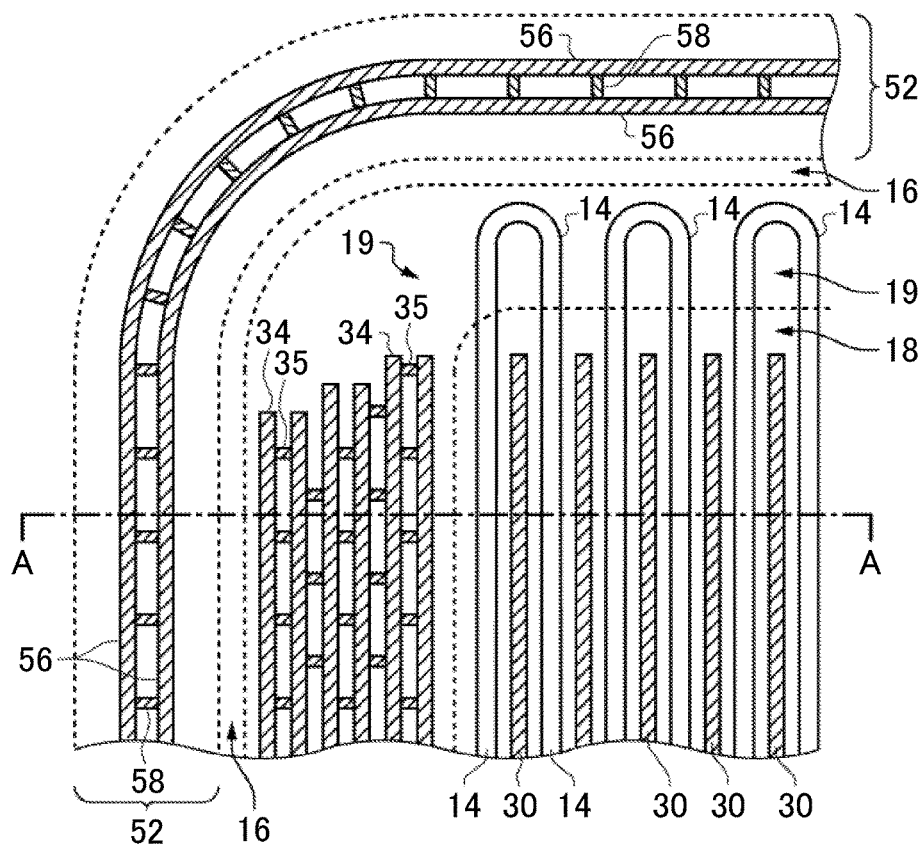
FIG. 6B is a diagram illustrating one example of the upper surface of the semiconductor device 100 illustrated in FIG. 6A.

FIG. 6B is a diagram illustrating one example of the upper surface of the semiconductor device 100 illustrated in FIG. 6A. Note that the cross sectional view illustrated in FIG. 6A corresponds to the A-A cross section in FIG. 6B. Also, the semiconductor device 100 illustrated in FIG. 6B includes six hole diverting plugs 34.

FIG. 6B illustrates the drift region 16, the base region 18, the well region 19, the gate structure 14, the hole diverting plug 34, the connection plug 35, the tungsten plug 56, the connection plug 58 and the field plate 52, while other structures are omitted. For example, in at least some regions of the upper surface of the base region 18 formed in a region sandwiched by the gate structure 14, the emitter region 22 is exposed as illustrated in FIG. 6A, while it is omitted in FIG. 6B. On the upper surface of the base region 18 formed in a region sandwiched by the gate structure 14, the emitter regions 22 and P+ type contact regions may be formed alternately along an extending direction of the trench of the gate structure 14.

In the present example, each hole diverting plug 34 is arranged to be parallel with the extending direction of the trench of the gate structure 14. The hole diverting plug 34 is provided in a region in which holes flow during switching of the semiconductor device 100. Also, the connection plug 35 connects two adjacent hole diverting plugs 34. A plurality of connection plugs 35 may also be provided in a discrete manner between two adjacent hole diverting plugs 34 in the extending direction of the hole diverting plugs 34. This can eliminate a current imbalance between hole diverting plugs 34, thereby improving the turn off resistance.

The length between the adjacent hole diverting plugs 34 (that is, the distance between the adjacent hole diverting plugs 34) may be shorter than the length between the adjacent connection portions 30 in the semiconductor element section 13 (that is, the distance between the adjacent connection portions 30). This can further improve the turn off resistance. Furthermore, the semiconductor element section 13 may comprise an N type accumulation region 17 having a higher concentration than that of the drift region 16, in a region sandwiched by the trenches of the gate structure 14 below the base region 18. Also, the N type accumulation region 17 may not be provided below the hole diverting plug 34. This can further improve the turn off resistance while reducing an ON voltage.

Note that, as illustrated in FIG. 5, a connection plug 58 may be formed t two or more circular tungsten plugs 56. Also, the connection portion 30 may also be provided between the trench of the gate structure 14 and a plurality of hole diverting plugs 34. The connection portion 30 connects to the base region 18. The connection portion 30 and the hole diverting plug 34 adjacent thereto may be connected by the connection plug 35.

Figure 7:
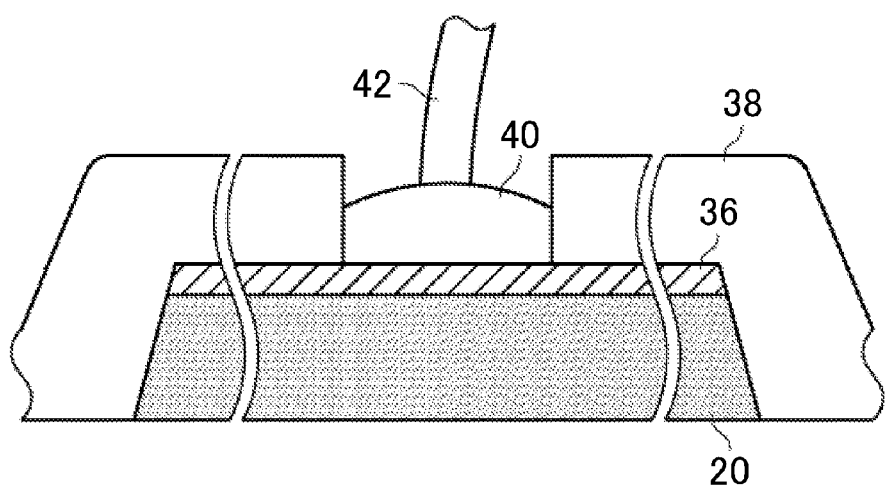
FIG. 7 is an enlarged cross sectional view the emitter electrode 20 and the vicinity thereof.

FIG. 7 is an enlarged cross sectional view the emitter electrode 20 and the vicinity thereof. The semiconductor device 100 of the present example further includes a plating layer 36, a protection film 38, a solder section 40 and a wire 42. The plating layer 36 is formed on the emitter electrode 20.

The plating layer 36 contains nickel, for example, and is formed by way of an electroless plating method, for example. The plating layer 36 is formed on the entire upper surface of the emitter electrode 20. The plating layer 36 may be thicker or thinner than the emitter electrode 20. To prevent nickel from being oxidized, displacement Au (gold) plating may also be formed on an outer surface of nickel.

The emitter electrode 20 is formed of material which is more easily plated than the field plate 52. For example, the emitter electrode 20 is formed of aluminum or aluminum-containing alloy. As one example, the emitter electrode 20 is formed of AlSi alloy. Also, the field plate 52 of the present example is formed of tungsten or tungsten-containing alloy. As tungsten is a stable material, an oxide film is immediately formed thereon due to flush after activation, even if a pretreatment is performed on an outer surface of tungsten to remove an oxide coated layer thereon and activate the outer surface. Therefore, a plating is not easily formed on the outer surface of the field plate 52.

The protection film 38 is formed above the entire semiconductor substrate 10 after the plating layer 36 is formed. However, the protection film 38 on the plating layer 36 covers some regions of the plating layer 36. An opening is formed through the protection film 38 to expose some regions of the plating layer 36. The protection film 38 is formed of polyimide, for example. The protection film 38 may also be formed on the field plate 52.

The solder section 40 is formed at the opening portion of the protection film 38 to electrically connect the wire 42 and the plating layer 36. In the present example, the field plate 52 is formed of tungsten, for example. Therefore, the plating layer 36 can be selectively formed on the emitter electrode 20 even if the field plate 52 is not covered by a protection film and the like when the plating layer 36 is formed.

Then, as the protection film 38 and the opening are formed after the plating layer 36 is formed, the opening can be formed on the plating layer 36. That is, as a side wall of the opening terminates on an upper surface of the plating layer 36, the solder section 40 and the like can be prevented to extend through the side wall of the opening and reach the emitter electrode 20. This can protect the emitter electrode 20 and the like. Note that a plurality of groups of the opening of the protection film 38, the solder section 40 and the wire 42 may be formed in a discrete manner.

Figure 8A:
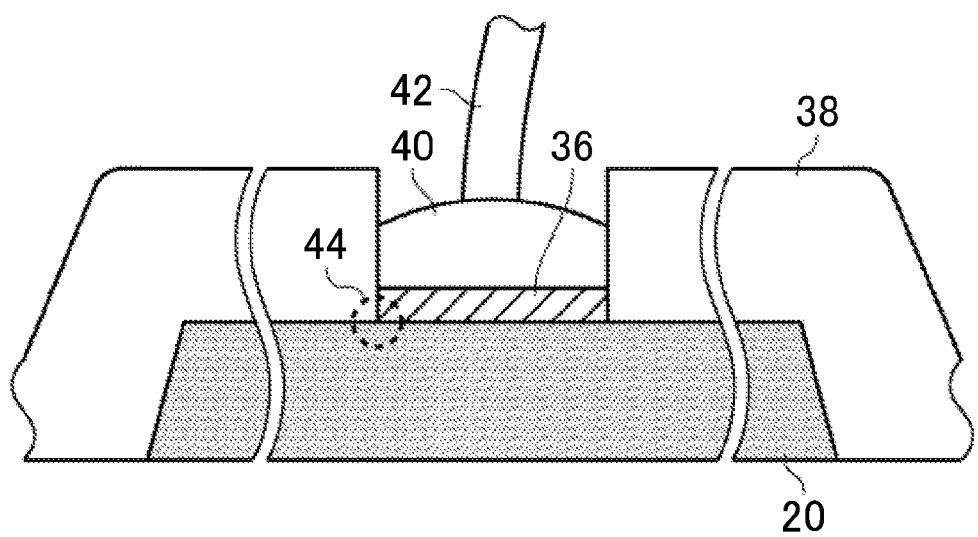
FIG. 8A is an enlarged cross sectional view another example of the emitter electrode 20 and the vicinity thereof.
Figure 8B:
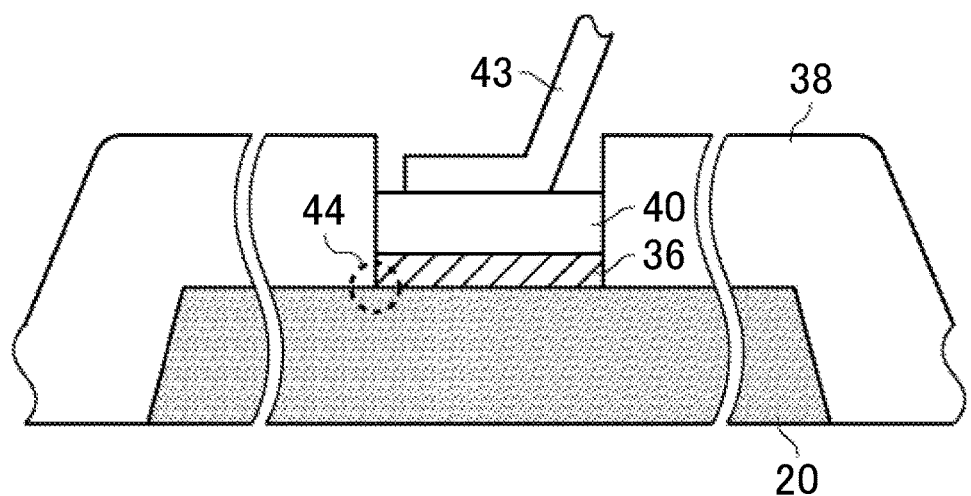
FIG. 8B is an example in which the wire 42 in FIG. 8A is replaced with the leadframe 43.

FIG. 8A is an enlarged cross sectional view another example of the emitter electrode 20 and the vicinity thereof. In the present example, the protection film 38 is formed on the emitter electrode 20. Also, the side wall of the opening formed through the protection film 38 terminates on the upper surface of the emitter electrode 20. The plating layer 36, the solder section 40 and the wire 42 are formed within the opening. The plating layer 36 is formed using the protection film 38 as a mask. FIG. 8B is an example in which the wire 42 in FIG. 8A is replaced with the leadframe 43.

In the examples of FIG. 8A and FIG. 8B, there exists a triple point 44 at which end portions of the protection film 38, the plating layer 36 and the emitter electrode 20 intersect. Therefore, a solder of the solder section 40, for example, may extend between a side wall of the protection film 38 and a side wall of the plating layer 36 and reach the emitter electrode 20. In the example illustrated in FIG. 7, a triple point 44 does not exist, thereby improving the reliability of the emitter electrode 20, for example, as described above. Note that, in the example of FIG. 7, the wire 42 can also be replaced with the leadframe 43.

Also, in the examples illustrated in FIG. 8A and FIG. 8B, as the plating layer 36 is formed after the protection film 38 is formed, the protection film 38 may be damaged due to plating at a high temperature. Therefore, as the plating layer 36 must be formed at a low temperature, it is relatively difficult to form the plating layer 36 efficiently. On the other hand, in the example of FIG. 7, the plating layer 36 can be formed at a high temperature.

Figure 9:
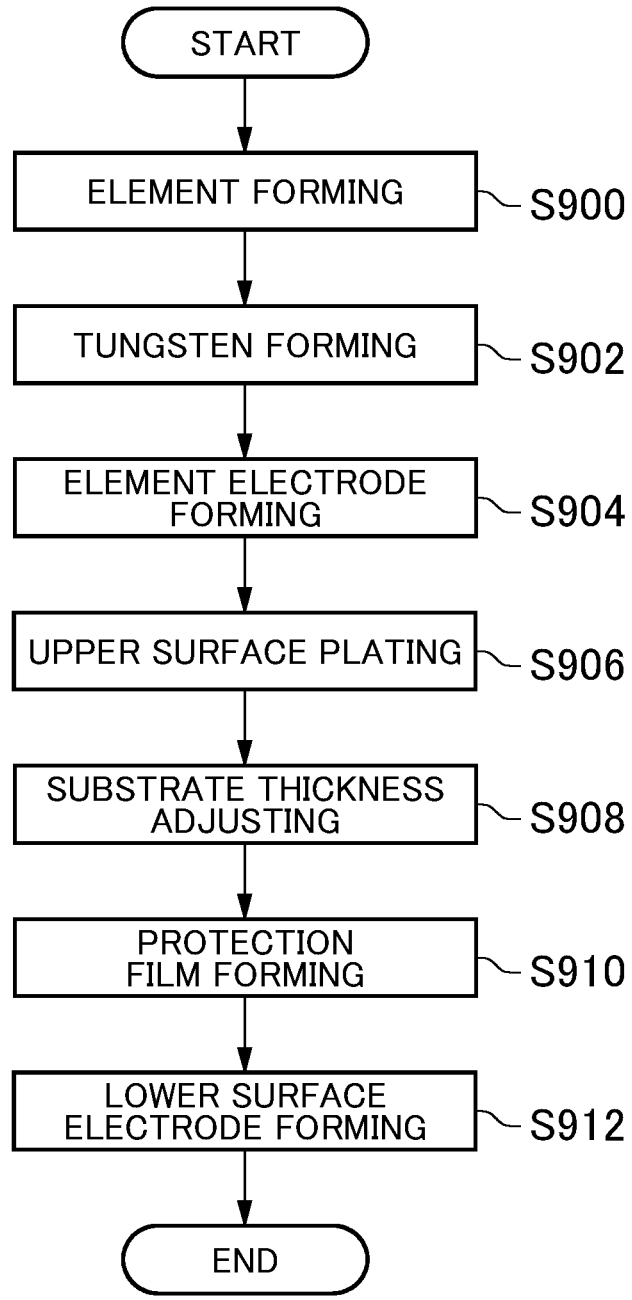
FIG. 9 is a diagram illustrating one example of a manufacturing method of the semiconductor device 100.

FIG. 9 is a diagram illustrating one example of a manufacturing method of the semiconductor device 100 according to an embodiment of the present invention. First, in an element forming step S900, each impurity region and the gate structure 14 of the semiconductor substrate 10 are formed. Also, the element forming step S900 includes an insulating film forming step of forming the interlayer insulating film 12 and a guard ring forming step of forming the guard ring 54.

Next, in a tungsten forming step S902, tungsten is deposited on the interlayer insulating film 12 after a through hole is formed through the interlayer insulating film 12. This allows the tungsten plug 56 and the connection portion 30 to be formed to penetrate the interlayer insulating film 12. Also, the tungsten forming step S902 includes a field plate forming step of forming the field plate 52. In S902, tungsten deposited on the interlayer insulating film 12 is patterned to form the field plate 52.

Next, in an element electrode forming step S904, the emitter electrode 20 is formed of aluminum-containing material above the upper surface of the semiconductor substrate 10 in the active region 11. As illustrated in FIG. 3, the emitter electrode 20 may also be formed on the foundation electrode 32. In this case, the foundation electrode 32 is formed in the tungsten forming step S902.

Next, in a plating step S906, the plating layer 36 is formed at the upper surface side of the semiconductor substrate 10. A mask covering the field plate 52 may not be formed in this step. The plating step S906 allows the plating layer 36 to be selectively formed on the upper surface of the emitter electrode 20.

Next, in a substrate thickness adjusting step S908, a thickness of the semiconductor substrate 10 is adjusted by grinding a lower surface side of the semiconductor substrate 10, depending on a given breakdown voltage. Next, in a protection film forming step S910, the protection film 38 is formed at the upper surface side of the semiconductor substrate 10. Forming the protection film 38 may be performed prior to adjusting the substrate thickness.

Next, in a lower surface electrode forming step S912, the collector electrode and the like are formed at the lower surface of the semiconductor substrate 10. Also, the opening is formed at a given location of the protection film 38 to form the solder section 40 and the wire 42.

Such a method allows the semiconductor device 100 using the tungsten plug 56 to be manufactured. Also, the semiconductor device 100 comprising the structure illustrated in FIG. 7 can be manufactured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

In the specification, the terms "on", "under", "above", "below", "upper surface", "lower surface" are not limited to up and down in the direction of gravitational force. These terms mean a relative direction along an arbitrary axis.

EXPLANATION OF REFERENCES

10: semiconductor substrate, 11: active region, 12: interlayer insulating film, 13: semiconductor element section, 14: gate structure, 16: drift region, 17: accumulation region, 18: base region, 19: well region, 20: emitter electrode, 21: pad, 22: emitter region, 24: collector region, 26: collector electrode, 30: connection portion, 32: foundation electrode, 34: hole diverting plug, 35: connection plug, 36: plating layer, 38: protection film, 40: solder section, 42: wire, 43: leadframe, 44: triple point, 50: guard ring section, 52: field plate, 54: guard ring, 56: tungsten plug: 58: connection plug, 100: semiconductor device

What is claimed is:

1. A semiconductor device comprising:
a semiconductor substrate;
an active region formed in the semiconductor substrate; and
a guard ring section formed more outside than the active region in the semiconductor substrate, wherein the guard ring section includes:
a guard ring formed in a circular pattern on an upper surface of the semiconductor substrate, the guard ring being a single doped region;
an interlayer insulating film formed above the guard ring;
a field plate formed in a circular pattern along the guard ring and above the interlayer insulating film;
two tungsten plugs formed in a circular pattern along the guard ring and penetrating the interlayer insulating film to connect the guard ring and the field plate, the two tungsten plugs being in direct physical contact with the guard ring and the field plate; and
a connection plug connecting the two tungsten plugs at one or more portions of each tungsten plug.

2. The semiconductor device according to claim 1, wherein the field plate is formed of tungsten.

3. The semiconductor device according to claim 1, wherein a distance between two adjacent tungsten plugs in the plurality of circular tungsten plugs is larger than a width of one tungsten plug.

4. The semiconductor device according to claim 2 further comprising:
an element electrode provided above the active region and formed of aluminum-containing material;
a plating layer formed on the element electrode; and
a protection film formed on the plating layer and exposing some regions of the plating layer.

5. The semiconductor device according to claim 1 further comprising:
a semiconductor element section formed in the active region; and
a hole diverting plug provided between the semiconductor element section and the guard ring section to penetrate the interlayer insulating film and formed of tungsten.

6. The semiconductor device according to claim 1 further comprising an element electrode provided above the active region, wherein the field plate is formed of same material as that of the element electrode.

7. The semiconductor device according to claim 1, wherein each tungsten plug has one end in direct physical contact with the field plate and the other end in direct physical contact with the guard ring.

8. A manufacturing method of a semiconductor device comprising:
forming a guard ring in a circular pattern on an upper surface of a semiconductor substrate, the guard ring being a single doped region;
forming an interlayer insulating film above the guard ring; and
simultaneously forming a plurality of tungsten plugs provided in a circular pattern on the guard ring to penetrate the interlayer insulating film and a field plate in a circular pattern provided along the guard ring and above the interlayer insulating film to connect to the plurality of tungsten plugs, the plurality of tungsten plugs being in direct physical contact with the guard ring and the field plate.

9. The manufacturing method according to claim 8 further comprising:
forming an element electrode of aluminum-containing material in an active region surrounded by the guard ring on the upper surface of the semiconductor substrate;
forming a plating layer on the element electrode after the forming the element electrode and the forming the field plate by plating the upper surface side of the semiconductor substrate; and forming a protection film at the upper surface side of the semiconductor substrate after the plating.

10. The manufacturing method according to claim 8, wherein each tungsten plug has one end in direct physical contact with the field plate and the other end in direct physical contact with the guard ring.

* * * * *